United States Patent [19]

Benenati et al.

[11] Patent Number: 4,783,697

[45] Date of Patent: Nov. 8, 1988

[54] LEADLESS CHIP CARRIER FOR RF POWER TRANSISTORS OR THE LIKE

[75] Inventors: Robert Benenati; Joseph Desjardins, both of Tamarac, Fla.; James E. Mitzlaff, Carpentersville, Ill.; Scott D. Beutler, Des Plaines, Ill.; Mike M. Albert, Chicago, Ill.; Vernon L. Brown, Barrington, Ill.

[73] Assignee: Motorola, Inc., Schaumburg, Ill.

[21] Appl. No.: 902,901

[22] Filed: Sep. 2, 1986

Related U.S. Application Data

[63] Continuation-in-part of Ser. No. 689,411, Jan. 7, 1985, abandoned.

[51] Int. Cl.$^4$ .................. H01L 39/02; H02G 13/08
[52] U.S. Cl. ........................ 357/80; 357/74; 357/70; 357/68; 357/65; 174/52 FP; 174/52 R; 361/404; 361/403; 361/409; 439/71
[58] Field of Search ............ 357/80, 70, 68, 65, 357/35, 74; 174/52 FP, 52 R, 68.5; 361/403, 404, 405, 406, 409, 410, 397, 398, 413; 339/17 LC, 17 C, 17 CF, 61 M, 176 MP, 21 R

[56] References Cited

U.S. PATENT DOCUMENTS

| | | | |
|---|---|---|---|
| 3,649,881 | 3/1972 | Chang et al. | 357/80 |
| 3,684,931 | 8/1972 | Taniguchi | 357/80 |
| 3,710,202 | 1/1973 | Leidich et al. | 357/70 |
| 3,713,006 | 1/1973 | Litty et al. | 357/70 |
| 3,784,883 | 1/1974 | Duncan et al. | 357/74 |
| 3,864,727 | 2/1975 | Schoberl | 357/65 |
| 3,875,478 | 4/1975 | Capstick | 357/80 |
| 3,893,159 | 7/1975 | Martin | 357/70 |
| 3,916,434 | 10/1975 | Garboushian | 357/74 |
| 3,958,195 | 5/1976 | Johnson | 357/80 |
| 3,996,603 | 12/1976 | Smith | 357/80 |
| 4,000,054 | 12/1976 | Marcantonio | 361/410 |
| 4,076,355 | 2/1978 | Olsson et al. | 339/17 C |
| 4,079,511 | 3/1978 | Grabbe | 29/627 |
| 4,246,697 | 1/1981 | Smith | 29/827 |
| 4,278,991 | 7/1981 | Ritchie et al. | 351/81 |
| 4,423,468 | 12/1983 | Gatto et al. | 361/404 |
| 4,425,575 | 1/1984 | Doyen et al. | 357/81 |
| 4,446,477 | 5/1984 | Currie et al. | 351/74 |

Primary Examiner—William L. Sikes
Assistant Examiner—Georgia Y. Epps
Attorney, Agent, or Firm—Donald B. Southard; Charles L. Warren

[57] ABSTRACT

A leadless chip carrier for RF power transistors or the like is disclosed which includes a body of insulating material having two major surfaces and side walls joining the major surfaces. In a first embodiment, a pattern of conductive pads is deposited on one major surface. A pattern of conductive contact areas is deposited on the other major surface and distributed interconnecting portions of conductive material are deposited to connect the pads to the respective contact areas. In a second embodiment, larger pads and contact areas are provided on a beryllia substrate to provide a leadless chip carrier for RF transistors capable of handling 8 watts. In a third embodiment, a single slot is made conductive to provide the distributed interconnecting portion for one terminal, while in a fourth embodiment, the slot is changed to a plurality of small, tungsten-filled through holes to provide a virtually hermetically sealed leadless chip carrier for RF power transistors.

24 Claims, 4 Drawing Sheets

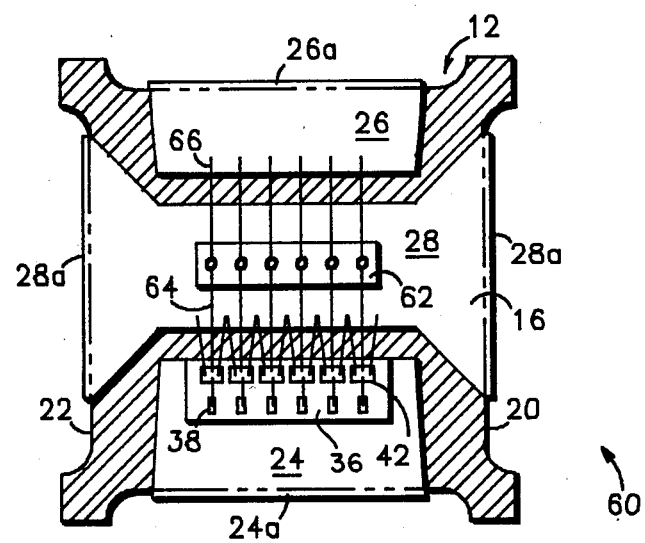
FIG. 3
FIG. 4
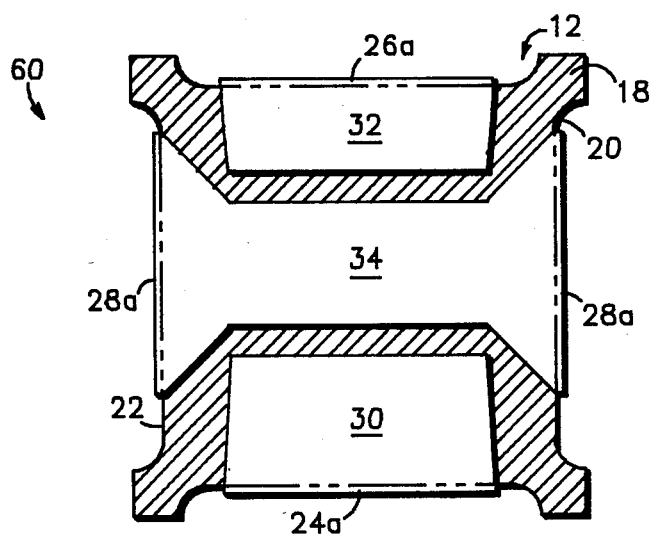

LEADLESS CHIP CARRIER FOR RF POWER TRANSISTORS OR THE LIKE

CROSS REFERENCE TO RELATED APPLICATIONS

This application is a continuing application and specifically a continuation-in-part patent application based on a US Patent Application of the same title, Ser. No. 06/689,411, filed Jan. 7, 1985, now abandoned.

BACKGROUND OF THE INVENTION

The present invention generally relates to transistor chip carriers, and more specifically, to leadless chip carriers for radio frequency (RF) power transistors.

Transistors find use in a wide range of electronic applications. For example, transistors find use in low power applications such as oscillator circuits, and high power applications such as power amplifiers. To facilitate the use of transistors in such applications, the transistors, which are usually in the form of semiconductor dies or chips, are usually housed in a carrier or package suitable for either a low power, high density application, such as a chip carrier, or for a high power application, such as a stripline-opposed-emitter (SOE) package having low lead inductance. Such packages are usually formed from an electrically insulating material having thermal properties and mounting configurations appropriate for the amount of heat dissipation expected to be encountered from the transistor devices. In the case of an RF device, the packages not only provide a housing for the transistor devices, but they also provide room for impedance matching circuitry which is necessary for proper operation in a given circuit application. The carriers provide encapsulation of the transistor device dies, or chips, to protect them from the external environment as well as from rough handling encountered during manufacturing, testing, or assembling them into a final product.

One problem associated with prior art carriers for RF power devices is that they do not afford automated testing of the packaged transistor devices before final interconnection into a circuit. This is due to the fact that prior art carriers, especially the SOE package, require special circuit board techniques to accommodate the relatively wide, external metal straps or leads which electrically connect to the base, emitter, and collector terminals of the internal individual devices. The fact that these packages require special circuit boards for the metal straps makes automated testing very awkward. The leads themselves are fragile, easily bent or broken, and they greatly affect the overall manufacturing cost. As a result, these packages preclude automated placement, requiring individual placement and soldering into a circuit board in a final product. Such prior art carriers for RF power devices, therefore, cannot take advantage of more efficient and economical manufacturing processes, such as automated placement and reflow soldering.

It is therefore an object of the present invention to provide a new and improved leadless chip carrier suitable for RF power transistors or the like which overcomes the foregoing deficiencies.

It is a further object of the present invention to provide a leadless chip carrier of the foregoing type which affords testing of the completed chip carrier including the transistor devices and any included matching circuitry prior to interconnection into a circuit.

It is a still further object of the present invention to provide a leadless chip carrier of the foregoing type which permits electrical connection of the terminals beneath the completed chip carrier to accompanying circuitry by automated placement and reflow soldering techniques.

It is a still further object of the present invention to provide a method of making a new and improved leadless chip carrier suitable for RF power transistors or the like.

SUMMARY OF THE INVENTION

The present invention provides various assemblies and a method of making a leadless chip carrier for power transistors, such as radio frequency (RF) power transistors, which facilitate testing of the completed chip carrier with transistor devices prior to their interconnection into a circuit. The invention includes a body of insulating material known as a substrate having a pair of major, substantially planar surfaces and a thickness made up of four side walls joining these major surfaces. A pattern of conductive material is deposited on one of the major surfaces to form separate conductive pads for connection to respective terminals of a semiconductor device die such as a transistor.

A plurality of separated contact areas of similar conductive material are affixed or deposited on the other major surface. Interconnecting portions of conductive material are deposited on or within the substrate to connect each conductive pad on one of the major surfaces to its respective corresponding contact area on the other of the major surfaces.

One of the pads of the chip carrier is arranged to receive a semiconductor device die, such as a transistor die, and make direct contact to one of the device terminals. In the several exemplary embodiments which follow, the leadless chip carrier provides one pad which connects to the collector terminal, another pad to the base terminal, and a third pad to the emitter terminal of the semiconductor device.

The leadless chip carrier of the present invention may also include at least one "via" comprising a hole or slot in the substrate body of the chip carrier. The interconnecting portion of conductive material, which extends through the substrate, connects a particular pad on the top surface with the corresponding contact area on the bottom surface of the leadless chip carrier. These "vias" may be utilized in conjunction with edge-wrapped interconnecting portions or may be utilized without any edge-wrapping around the side walls of the body of the chip carrier.

These and other objects of the present invention will become apparent to those skilled in the art upon consideration of the accompanying specification, claims, and drawings.

BRIEF DESCRIPTION OF THE DRAWINGS

Referring to the drawings, wherein like reference numerals identify like elements in the several figures and in which:

FIG. 3 is a front view of a leadless chip carrier for RF power transistors or the like in accordance with a further embodiment of the present invention.

FIG. 4 is a back view of the leadless chip carrier of FIG. 3.

DESCRIPTION OF THE PREFERRED EMBODIMENTS

Figure 1:
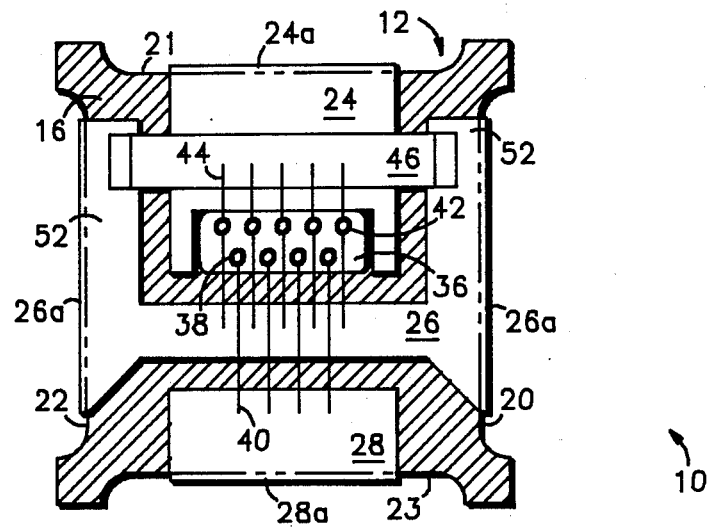
FIG. 1 is a front view of a leadless chip carrier for RF power transistors or the like in accordance with one embodiment of the present invention.
Figure 2:
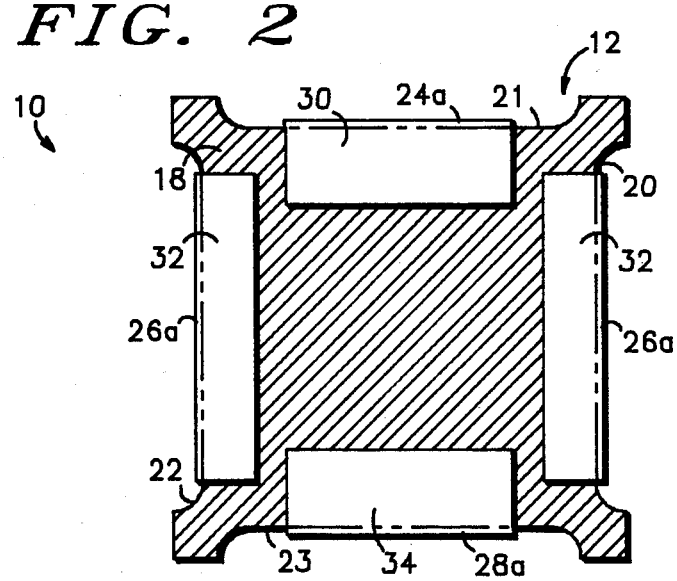
FIG. 2 is a back view of the leadless chip carrier of FIG. 1.

With respect to the drawings, FIGS. 1 and 2 respectively illustrate front and back views of a first embodiment of the leadless chip carrier 10 for transistors, such as radio frequency (RF) power transistors, in accordance with the present invention. Chip carrier 10 is particularly suitable for low RF output power transistor applications where the transistor must provide an output power on the order of three (3) watts. Chip carrier 10 includes a substrate 12 which is preferably formed of insulative material such as alumina, or other suitable material chosen for its electrical insulating as well as heat dissipating characteristics. Substrate 12 has two major surfaces 16 and 18, respectively, serving as a top surface, shown in FIG. 1, and a bottom surface, shown in FIG. 2. Major surfaces 16 and 18 are separated by a finite thickness and joined by side walls 20, 21, 22, and 23.

Chip carrier 10 also includes on its top surface 16 a pattern of conductive material deposited by any one of a number of well known methods. The pattern of conductive material includes a plurality of separated conductive pads, such as pads 24, 26, and 28 shown in FIG. 1. On the bottom surface 18, a pattern of similar conductive material is deposited by the same method suitable for the top surface, and includes a plurality of separated conductive contact areas, such as areas 30, 32, and 34 shown in FIG. 2. Note in this figure that there are two areas labelled 32 on opposing ends of the surface which are connected together across the top surface, as depicted in FIG. 1.

Substrate 12 is also configured to have a semiconductor device die 36, such as a transistor die, mounted generally on surface 16. When the device die 36 is a transistor die having collector, emitter, and base terminals, they are connected respectively to pads 24, 26, and 28, as shown. Such connections are represented in FIG. 1 by base bond sites 38, which are connected to base pad 28 by leads 40, and emitter bond sites 42, which are connected to the emitter pad 26 via leads 44. The collector of the transistor die here is specifically connected to collector pad 24 to which it is adjacent. Of course, the collector of the transistor die could also be directly connected to the collector pad 24, if pad 24 extended out to encompass the area beneath transistor die 36.

The chip carrier 10 also includes on its top major surface 16, a crossover 46, known as an emitter bridge, connecting opposite extremes of emitter pad portion 26 to one another. Crossover 46 serves to equalize the emitter currents which flow out of the device towards both sides 52, and thus provides more uniform power output over the device frequency range.

To complete the chip carrier 10, interconnecting portions 24a, 26a, and 28a of conductive material are respectively deposited onto and wrapped around the sides 20, 21, 22, and 23 of substrate 12. The interconnecting portion 24a serves to interconnect collector pad 24 on top surface 16 with the corresponding contact area 30 on bottom surface 18. The two interconnecting portions 26a serve to interconnect the opposite extremes 52 of emitter pad 26 with the respective contact areas 32. And, the interconnecting portion 28a serves to interconnect the base pad 28 with its respective contact area 34.

As can be seen from the description above with reference to FIGS. 1 and 2, chip carrier 10 allows device die 36, such as a transistor, to be readily mounted onto substrate 12 of the leadless chip carrier. The device die has its collector, emitter, and base electrically connected to collector pad 24, emitter pad 26, and base pad 28, respectively. Through the use of the previously mentioned interconnecting portions, these pads connect to the bottom surface areas to effectively connect the collector, emitter, and base of transistor 36 to collector contact area 30, emitter contact area 32, and bsae contact area 34. To finish the assembly, an encapsulation or installation of a cover (not shown) may be attached to surface 16 utilizing an adhesive such as thermal epoxy which is readily available for this purpose. Clearly, it is then a simple matter to test transistor 36 at this early stage in the manufacture of this device configuration utilizing the now mounted transistor 36 before this leadless chip carrier is permanently attached in a given application, such as to a finished printed circuit board. This configuration, therefore, electrically communicates the collector, emitter, and base leads to the bottom surface 18 of the leadless chip carrier primarily by virtue of its "wrap-around" leads. It should now also be clear that the invention facilitates the attachment of the transistor to an installation such as a finished printed circuit board, whether it be for temporary testing or for permanent mounting utilizing reflow soldering.

Therefore, the present invention provides a semiconductor device which functions as a stand-alone unit which can be mechanically and electrically tested, stored for further use without significant damage to its leads and internal connections, or readily reflow soldered directly to a hybrid of finished printed circuit board. In addition, this leadless chip carrier assembly is well suited to automated robot handling by virtue of its shape and relative ruggedness.

A further leadless chip carrier 60 embodying the present invention is illustrated in FIGS. 3 and 4. This leadless chip carrier 60 is particularly suited to high power output applications, having power outputs on the order of eight (8) watts. As previously noted, where like structural elements exist among the various figures, they are identified by like reference numerals. An initial departure of the chip carrier 60 from the chip carrier 10 which is primarily responsible for making carrier 60 more suitable to higher output applications is the specific choice of insulating material for substrate 12. Chip carrier 60 utilizes a material such as beryllia for substrate 12 because of its greater heat dissipating capability than a material such as alumina, which was the preferred material for substrate 12 of chip carrier 10. In chip carrier 60, the same configuration of pads 24, 26, and 28 are wrapped around the top, bottom, and sides of substrate 12 to provide distributed interconnecting portions 24a, 26a, and 28a so as to be contiguous with contact areas 30, 32, and 34, respectively. Thus, chip carrier 60 achieves the same advantages as noted above with respect to chip carrier 10.

FIG. 3 illustrates an arrangement different from that of FIG. 1. The chip carrier 60 depicted in FIG. 3 includes an additional component near the semiconductor device die 36. This additional component is a passive component in the form of a metal oxide semiconductor (MOS) capacitor 62. Capacitor 62 is mounted on pad 28, which functions in this embodiment as the emitter pad. Capacitor 62 is also connected by wire bond leads 66 to pad 26, which functions in this embodiment as the input pad. In addition, capacitor 62 is connected to base bond sites 38 by wire bond leads 64.

FIG. 4 illustrates the bottom side of chip carrier 60, including distributed interconnecting portions 24a, 26a, and 28a, with each of the opposite extremes of bottom surface 18 connected via contact area 34. This structure provides an extremely low loss connection from the emitter terminals 42 of device 36 by minimizing resistive power loss (due to I$^2$R) as well as reactive power loss (due to inductance from the top surface of the emitter pad 28 around to the bottom emitter contact area 34). Note that the emitter terminals 42 are connected together in zig-zag fashion (stitch bonding) to also provide multiple parallel paths for the emitter currents flowing through them.

Figure 5:
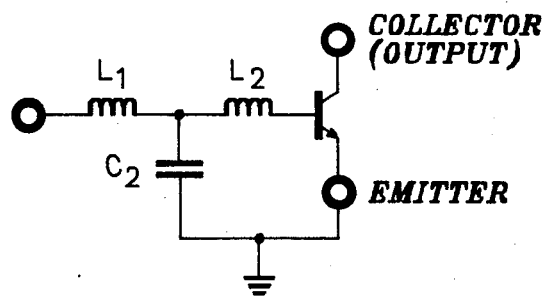
FIG. 5 is a circuit diagram illustrating the inductances and capacitance to ground provided by the structure in the leadless chip carrier of FIGS. 3 and 4.

FIG. 5 illustrates a schematic circuit diagram representing the inductances and capacitances to ground as provided by the elements within the structure of FIGS. 3 and 4. $L_1$ represents the wire bond leads 66 between the input pad 26 and the MOS capacitor 62. $L_2$ represents the wire bond leads 64 between the MOS capacitor 62 and the base bond sites 38. $C_2$ represents the MOS capacitor 62. This schematic circuit diagram is a simplification of the actual circuitry employed by leadless chip carrier 60 in that, although one transistor device is shown, in fact multiple transistor devices are usually paralleled up to provide the desired amount of RF power output from single or multiple transistor dies. FIG. 3 depicts by way of example six transistor devices on one semiconductor die which are connected in parallel to pads 24, 26, and 28. Also as shown, capacitor 62 is actually six separate capacitors configured on one MOS capacitor die. Here chip carrier 60 employs direct contact between MOS capacitor 62 and emitter pad 28. Thus, it is apparent that the wire bond leads 64 and 66 provide series inductances and capacitor 62 provides capacitance to ground to form a "T" configuration matching circuit to the semiconductor device which reduces power loss and provides broader bandwidth.

Figure 6:
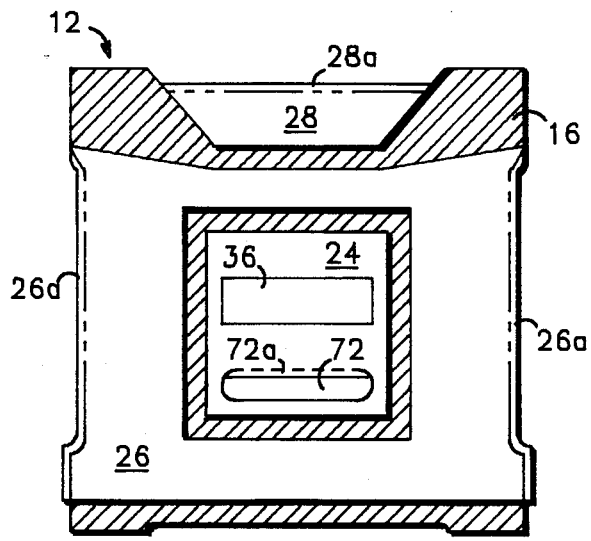
FIG. 6 is a front view of another leadless chip carrier for RF power transistors or the like in accordance with an alternate embodiment of the present invention.
Figure 7:
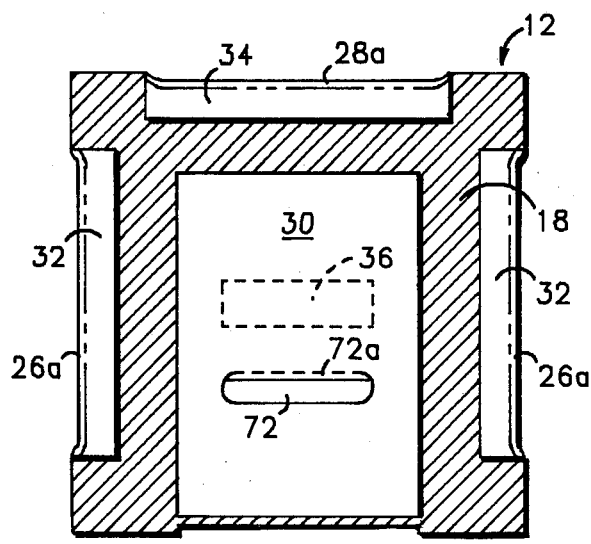
FIG. 7 is a back view corresponding to the leadless chip carrier of FIG. 6.

FIGS. 6 and 7 illustrate an alternate chip carrier 70 embodying the present invention. Chip carrier 70 includes the same configuration of pads 26 and 28 wrapping around the side walls of substrate 12 as distributed interconnecting portions 26a and 28a to effectively be contiguous with contact areas 32 and 34 on bottom surface 18 to achieve the same advantages. Although not illustrated explicitly in detail in FIG. 6, a semiconductor device die 36 is mountable in a region designated for its placement, as shown in FIG. 6 and as illustrated in phantom in FIG. 7. However, chip carrier 70 departs from the chip carriers 10 and 60 primarily in that it contains at least one open slot 72 through substrate 12 and within the bounds of collector pad 24. This is outlined on top surface 16 and within the bounds of collector contact area 30 on the bottom surface 18. Such a configuration allows the distributed interconnecting portion 72a to be routed through slot 72 rather than around a side wall of substrate 12, as was done in FIGS. 3 and 4. Here again, distributed interconnecting portion 72a may be deposited by utilizing conductive material on an inside wall of slot 72. It provides a distributed interconnecting portion near the center of a carrier substrate having a slot near the center of the substrate, and certainly multiple separate slots could be utilized to interconnect one or more pads on the top surface with their respective contact areas on the bottom surface of the substrate. It should also be noted that the essence of the present invention is that all of the semiconductor device leads are electrically communicated from the top surface 16 to the bottom surface 18 of the leadless chip carrier to facilitate surface-mount connections suitable for automated placement, testing, and automated assembly of a packaged power device onto a finished printed circuit board or hybrid.

Figure 8:
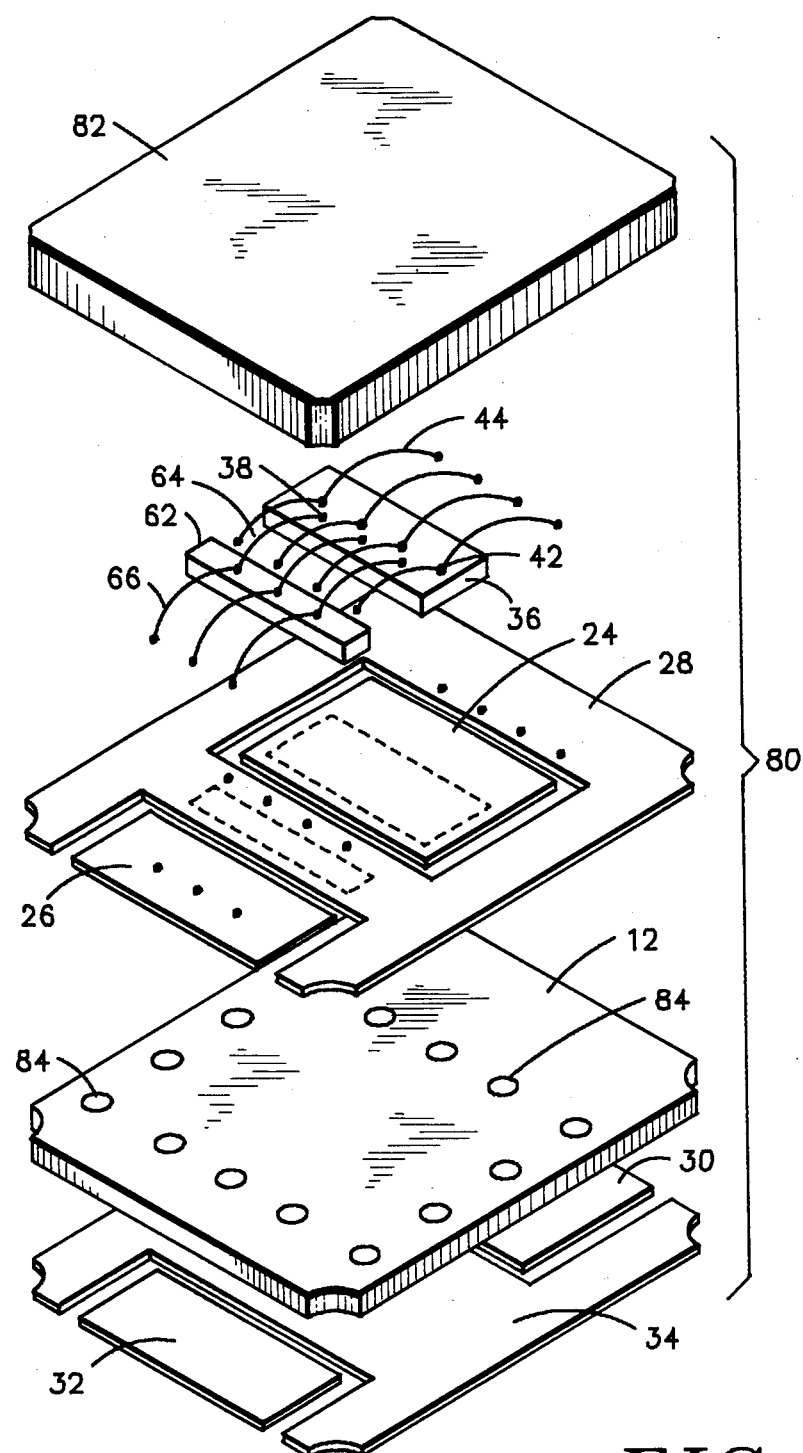
FIG. 8 is a perspective view of still another embodiment of the present invention, which evolved from the embodiment shown in FIGS. 6 and 7.

FIG. 8 illustrates a perspective view of still another embodiment of the present invention, which evolved from the embodiment shown in FIGS. 6 and 7, utilizing multiple slots or holes to provide the distributed interconnecting portions referred to above. In FIG. 8, a leadless chip carrier 80 includes a substrate 12 which has a top surface for mounting or affixing conductive pads 24, 26, and 28. Substrate 12 also has a bottom major surface to which is mounted or affixed conductive areas 30, 32, and 34 as shown. A semiconductor device 36, such as a transistor device die having a multiplicity of transistor devices, is mounted to contact pad 24 as shown by the dashed region on the surface of pad 24. This transistor device die 36 includes base terminals 38, three in this example, and also emitter terminals 42, as shown. The emitter terminals 42 include wire bonds 44 which connect to emitter pad 28 in two different regions as shown by solid dots on emitter pad 28. Also included in MOS capacitor 62, which is an optional element that has wire bond leads 64 connecting to transistor device base terminals 38 as well as input pad 26 via wire bond leads 66 as shown. Each of the sets of wire bond leads 44 and 66 connect to contact pad 28 and 26, respectively. Then, collector contact pad 24 is electrically coupled to contact area 30 via three distributed interconnecting portions 84 directly inbetween as shown. These distributed interconnecting portions are sealed holes or "vias" which are filled with tungsten to be electrically conductive. Furthermore, input pad 26 couples to input contact area 32 via another set of three distributed interconnecting portions 84 directly inbetween as shown. And finally, contact pad 28 which represents the emitter, couples to contact area 34 via distributed interconnecting portions represented by a group of metallized through holes 84 along the outside edge of substrate 12 so that the outer ends of "H" shaped contact area 34 connect to contact pad 28. Thus, chip carrier 80 utilizes a multiplicity of tungsten filled through holes 84 through substrate 12 to achieve low resistive and reactive power loss between the contact pads on the top surface with the contact areas on the bottom surface of substrate 12 to achieve a leadless chip carrier suitable for RF power transistors or the like. An encapsulation 82, such as a cover affixed utilizing thermal epoxy, can completely seal the leadless chip carrier 80 and the transistor device die 36 with its delicate matching circuit elements included. And, the smaller holes are easily manufactured and filled in substrate 12 when compared with the difficulty in making a slot 72 and adding a distributed interconnecting portion 72a in a configuration such as leadless chip carrier 70 of FIGS. 6 and 7. Therefore, leadless chip carrier 80 provides a very rugged and virtually hermetically sealed package capable of automatic testing, placement, and reflow soldering assembly procedures. Such a configuration would be desirable for certain stringent applications and clearly does not depart from the spirit or scope of the present invention.

While the present invention has been described in terms of common emitter configurations shown in several specific embodiments, it will be understood that the broader aspects of the present invention include common base configurations as well as the use of alternate conventional components, as would be obvious to those of skill in the art.

We claim:

1. A leadless chip carrier suitable for a power semiconductor device having a plurality of terminals, said carrier comprising in combination:
   a substantially planar substrate of insulating material having two major surfaces and a thickness;
   a conductive pattern on one of said major surfaces having at least a first, second, and third pad for receiving a semiconductive device on one pad thereof;
   a contact pattern on the other of said major surfaces having at least a first, second, and third area; and
   distributed interconnecting portions for electrically connecting the first, second, and third pads of the conductive pattern with their associated first, second, and third areas of the contact pattern, whereby said contact pattern permits leadless electrical connection of the chip carrier to accompanying external circuitry, and said distributed interconnecting portions provide wide paths for currents flowing between said conductive pattern and said contact pattern.

2. A leadless chip carrier according to claim 1, wherein said substantially planar substrate comprises alumina.

3. A leadless chip carrier according to claim 1, wherein said substantially planar substrate comprises beryllia.

4. A leadless chip carrier according to claim 1, wherein said conductive pattern comprises a first major pad having substantial coverage over two opposing side walls of said thickness, and a second and a third pad for substantially covering each of the remaining two opposing side walls of said planar substrate thickness.

5. The leadless chip carrier according to claim 4, wherein said first pad includes an emitter bridge assembly.

6. The leadless chip carrier according to claim 1, wherein said conductive pattern first pad includes a space for mounting and electrically connecting a passive component such as a capacitor thereto for providing internal matching to said semiconductor device.

7. The leadless chip carrier according to claim 1, wherein said conductive pattern includes at least one pad as an island surrounded by another pad.

8. The leadless chip carrier according to claim 1, wherein said contact pattern comprises a plurality of rectangular areas on the other of said major surfaces.

9. The leadless chip carrier according to claim 1, wherein said contact pattern comprises one large area approximately in the center, flanked by a plurality of smaller rectangular areas.

10. The leadless chip carrier according to claim 1, wherein said distributed interconnecting portions comprise wide conductive material wrapped around the thickness along the side walls joining said two major surfaces.

11. The leadless chip carrier according to claim 1, wherein said distributed interconnecting portions comprise a plurality of individual metallized vias.

12. The leadless chip carrier according to claim 1, wherein said distributed interconnecting portions comprise a plurality of individual tungsten filled vias.

13. The leadless chip carrier as defined in claim 1, wherein said conductive pattern includes a material such as gold.

14. The leadless chip carrier according to claim 1, wherein said contact pattern comprises a material such as gold.

15. The leadless chip carrier according to claim 1, wherein said carrier is arranged for receiving a transistor die having a collector, a base, and an emitter, and wherein said conductive pattern includes a respective pad for connection to said collector, base, and emitter of the transistor die.

16. A semiconductor device assembly comprising in combination:
   a semiconductor device die having a plurality of terminals:
   a leadless chip carrier including a substantially planar substrate of insulating material with two major surfaces separated by a thickness having four side walls joining said major surfaces, and conductive material on said surfaces including a plurality of separated pads on one of said major surfaces, a plurality of separated contact areas on the other of said major surface, and distributed interconnecting portions connecting said pads to said contact areas;
   said device die affixed to said one major surface of said carrier and said distributed interconnecting portions providing a wide electrical path between said pads and said contact areas such that any gaps between said distributed interconnecting portions are much less than a given dimension of said pads, whereby said multiple interconnecting portions handle relatively high electrical currents with minimal power loss as well as interconnect said device die terminals to said other major surface contact areas so as to electrically couple by way of leadless surface contacts to external circuitry.

17. The assembly according to claim 16, wherein said distributed interconnecting portions comprise a plurality of sealed tungsten filled vias extending through the thickness of said planar substrate so as to electrically couple one of said separated conductive pads to a respective one of said separated contact areas along a peripheral dimension thereof.

18. The assembly according to claim 16, wherein said device die is mounted on one of said conductive pads so as to make electrical contact to a given one terminal of said semiconductor device die so as to eliminate one set of wire bonds.

19. The assembly according to claim 16, wherein said leadless chip carrier includes distributed interconnecting portions comprising at least one elongated slot therethrough and including conductive material deposited on an inner wall formed by said elongated slot and electrically connecting at least one pad to a respective contact area thereon.

20. The assembly according to claim 16, wherein said conductive material is a good electrical conductor such as gold.

21. The assembly according to claim 16, wherein said insulating material is a ceramic such as alumina or beryllia.

22. The assembly according to claim 16, wherein said carrier accepts a transistor die having multiple similar transistors and wherein said conductive pattern includes a pad having at least one long dimension for connecting said transistors to each of at least three pads a multiple number of times utilizing bond wires to provide a collector, a base, and an emitter contact area on the other major surface thereof.

23. The assembly according to claim 22, further including a passive component, such as a capacitor mounted on a common pad alternately having emitter or base connections thereto, and including bond wires for connecting between an input pad and said passive component, and a pad alternately having base or emitter connections thereto, respectively.

24. The assembly according to claim 23, wherein the common pad having emitter connections thereto includes two opposite extremities of said carrier with at least one crossover connected between said extremities for attaching multiple bond wires to said emitter to encourage more uniform current flow thereby allowing a more symmetrical flow of output power.

* * * * *